Aug. 5, 1969 P. M. KISINKO ET AL 3,460,009

CONSTANT GAIN POWER TRANSISTOR

Filed Dec. 29, 1967

WITNESSES:

Bernard R. Giegucz

Donald M. Winegar

INVENTORS
Paul M. Kisinko and
Frederick G. Ernick.

BY

Frederick Shapoe

ATTORNEY

United States Patent Office 3,460,009
Patented Aug. 5, 1969

3,460,009
CONSTANT GAIN POWER TRANSISTOR

Paul M. Kisinko, Greensburg, and Frederick G. Ernick, Latrobe, Pa., assignors to Westinghouse Electric Corporation, Pittsburgh, Pa., a corporation of Pennsylvania Filed Dec. 29, 1967, Ser. No. 694,551
Int. Cl. H01l *11/00*
U.S. Cl. 317—235 10 Claims

ABSTRACT OF THE DISCLOSURE

A high power transistor having a constant gain over a range of collector currents comprises a body of N-type silicon semiconductor material having 0.01 ohm-centimeter resistivity upon which an epitaxially grown region of 3 ohm-centimeter resistivity N-type semiconductivity, 20±2 microns in thickness, is disposed. A 0.5 ohm-centimeter resistivity P-type semiconductivity region, 5 to 8 microns in thickness, is grown on the epitaxial N-type region. An N-type region is formed in a selective portion of the P-type region to produce a base width of 3±0.3 microns. The base width and physical characteristics produce the constant gain high power transistor.

BACKGROUND OF THE INVENTION

*Field of the invention.*—This invention relates to semiconductor devices, and in particular to a constant gain, high power transistor.

*Description of the prior art.*—Heretofore prior art high power transistors have been obtainable which had high gain and high speed characteristics. However, these prior art transistors had a peak for their high gain and then immediately began to have a decreasing gain value with an increasing collector current. The prior art devices demanded the circuit designers employing them in a specific application requiring a constant gain over a range of collector currents to include other electrical devices in conjunction with these prior art devices to achieve their circuit design requirements.

SUMMARY OF THE INVENTION

In accordance with the teachings of this invention there is provided a body of N-type semiconductivity silicon semiconductor material, the body having a resistivity no greater than 0.10 ohm-centimeter, a top surface, and a bottom surface; an ohmic electrical contact affixed to the bottom surface of the body; a region of N-type semiconductivity silicon semiconductor material epitaxially grown on the top surface of the body, the region having a resistivity of from 2.5 to 3.5 ohm-centimeters, a thickness of from 18 to 22 microns, and a constant impurity concentration profile curve; a region of P-type semiconductivity silicon semiconductor material epitaxially grown on the epitaxially grown region of N-type semiconductivity, the region having a thickness of from 3 microns to 8 microns and a resistivity of from 0.5 ohm-centimeter to 1 ohm-centimeter; a first P-N junction formed by the coextensive surfaces of the two epitaxially grown regions; a region of N-type semiconductivity formed in, and including a portion of the top surface of, the epitaxially grown region of P-type semiconductivity; and a second P-N junction formed by the coextensive surfaces of the formed N-type region and the epitaxially grown P-type region, the second P-N junction having at least a portion thereof no greater than 3.3 microns, and no less than 2.7 microns, from the first P–N junction.

An object of this invention is to provide a constant gain high power transistor.

Other objects of this invention will, in part, be obvious and will, in part, appear hereinafter.

DRAWINGS

For a better understanding of the nature and objects of this invention, reference should be had to the following drawings, in which.

DESCRIPTION OF THE INVENTION

Figure 1:
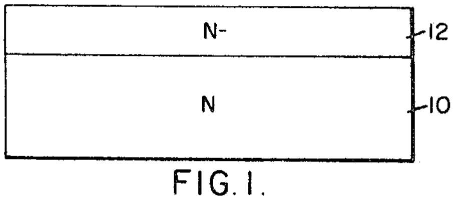
FIGS. 1 through 3 are views, partly in cross-section, of a body of semiconductor material being processed in accordance with the teachings of this invention.

With reference to FIG. 1, there is shown a body 10 of semiconductor material. The body 10 comprises any suitable semiconductor material. However, silicon is preferred because it has the best all around physical and electrical features which are desired to fulfill predetermined parameters. The body 10 should have as low a resistivity as possible, that is, 0.10 ohm-centimeter or less. To date the lowest resistivity material commercially available has a resistivity of 0.01 ohm-centimeter.

Since the body 10 will undergo several high temperature process steps, it is desirable that the material comprising the body 10 should be thermally stable. Therefore it is necessary that the material comprising the impurity in the body 10 of silicon should preferably have a low diffusion constant. Antimony and arsenic have low diffusion constants. Therefore, the employment of an antimony doped body 10 reduces out diffusion during a subsequent epitaxial growth process step which is practiced. The body 10 preferably comprises, therefore, N-type semiconductivity antimony doped silicon semiconductor material having a resistivity of 0.01 ohm-centimeter.

A region 12 of N-type semiconductivity silicon is epitaxially grown on a surface of the body 10 by any suitable means known to those skilled in the art. The N-region 12 has a resistivity of from 2.5 ohm-centimeters to 3.5 ohm-centimeters. The region 12 is from 18 to 22 microns in thickness. Preferably, the region 12 is 20 microns in thickness and has a resistivity of 3 ohm-centimeters. The parameters set forth for the region 12 are a compromise between several factors. For breakdown voltage purposes between the collector and the base of a device embodying the body 10, the resistivity of the region 12 should be as high as possible and the thickness of the region 12 should be as thick as possible. However, for saturation voltage purposes, the resistivity should be as low as possible and the thickness of the region 12 should be as thin as possible. Additionally to achieve the greatest gain for a device embodying the body 10 one also wants the region 12 to have as low a resistivity as possible as well as a thickness which is as thin as possible.

However, it has been discovered that when either the thickness of the region 12 exceeds 22 microns or when the resistivity of the region 12 exceeds 3.5 ohm-centimeters, the saturation voltage is high as one would desire it but the value of the constant high current gain over a range of collector currents of the processed body 10 begins to deteriorate below desirable requirements.

It is desirable to form the region 12 by epitaxial growth since a sharply defined junction will be formed between the region 12 and the body 10. A diffusion process will not provide a sharply defined junction. Additionally, during the epitaxial growth, the impurity can be introduced uniformly into the growing material and the resulting region 12 is uniformly doped throughout, that is, it has a substantially constant impurity concentration profile throughout the region 12. Phosphorus, in a suitable form, is a suitable impurity to be employed as dopant as it is easy to work with. However, antimony and arsenic are other suitable dopants.

Figure 2:
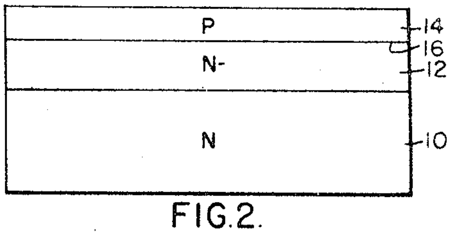

Referring now to FIG. 2, a region 14 of P-type semiconductivity silicon semiconductor material is epitaxially grown on the region 12 of N-type material. A P-N junction 16 is formed by the coextensive surfaces of the regions 12 and 14. The region 14 is at least 3 microns in thickness, but preferably the thickness of the region 14 is from 5 microns to 8 microns. This preferred width range is determined by the desired parameters for the base width of the finished processed body 10 and the subsequent manufacturing processes involved. It has been discovered that the base width parameter of a constant gain transistor should be 3 microns$\pm$0.3 micron. Preferably the base width is obtained by a diffusion process. Therefore if the region 14 is less than 3 microns, the process of establishing a base width of not less than 2.7 microns by diffusion becomes quite exacting. On the other hand if the thickness of the region 14 exceeds 8 microns, then the diffusion process time becomes increasingly longer from production and economic considerations and the control of the prepared base width parameter becomes harder to control.

The resistivity of the region 14 is from 0.5 ohm-centimeter to 1 ohm-centimeter. Preferably the resistivity should be as close to 0.5 ohm-centimeter as possible since below the value of 0.5, the high current gain of the processed body 10 decreases while if the value of resistivity exceeds 1, then the saturation voltage begins to drop off.

Figure 3:
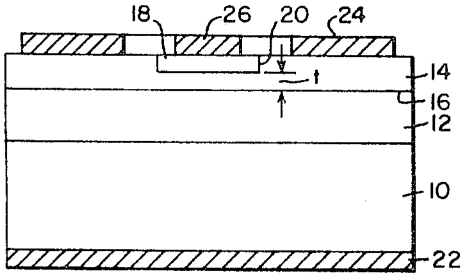

Referring now to FIG. 3, and employing suitable processes known to those skilled in the art such, for example, as an oxidation process followed by photolithographic techniques, a region 18 of N+ type semiconductivity is formed in the region 14. A process embodying $POCl_3$ as the source of the phosphorus impurity is preferred since high deposition surface concentrations can be obtained. It is preferred that the surface concentration of the phosphorus be from $10^{20}$ to $10^{21}$ atoms per cubic centimeter. This preferred concentration range enables one to obtain a preferred base width of 3 microns$\pm$0.3 micron and a region 18 having a sheet resistivity of less than 3 ohms per square. A P-N junction 20 is formed by the coextensive surfaces of the regions 14 and 18.

Figure 4:
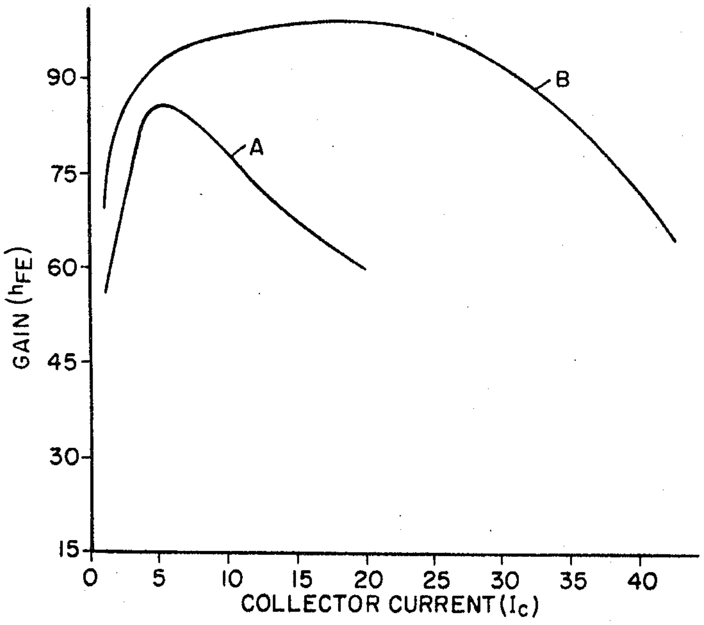
FIG. 4 is a graph of the gain versus the collector current of both a power transistor made in accordance with the teachings of this invention and a prior art power transistor.

The base width of 3 microns$\pm$0.3 micron has been found experimentally to produce a power transistor having a constant high current gain over an extended range of collector currents. To illustrate this desirable property, reference should be had to FIG. 4. FIG. 4 is the graph of gain versus collector current for two power transistors. Curve A depicts the properties of a prior art power transistor having an epitaxial base region having a resistivity of 12 ohm-centimeter. Curve B depicts the properties of a power transistor made in accordance with the teachings of this invention. The physical structures of both power transistors are the same, however, the device whose gain versus collector current is shown by curve B has a base region resistivity of only 3 ohm-centimeter. It is to be noted the device made in accordance with this invention has a higher gain and substantially a constant gain over a range of collector currents from 10 amperes to 25 amperes. Additionally, above 25 amperes the gain for the device does not initially fall off as rapidly as the prior art device.

The prior art device, on the other hand, has a lower gain which peaks at only a 5 ampere collector current and then drops off initially more rapidly than the present device when its gain begins to drop. The prior art device has a greater sustaining voltage while the device made in accordance with this invention has a higher current handling capability. Therefore, when a circuit designer can tolerate the employment of a low sustaining voltage power transistor while seeking a power transistor having a constant gain over an extended range of collector currents, then the power transistor made in accordance with the teachings of this invention fulfills his requirements.

Referring again to FIG. 3, the processing of the body 10 is completed by affixing ohmic electrical contacts 22, 24, and 26 respectively to the body 10 and the regions 14 and 18.

Figure 5:
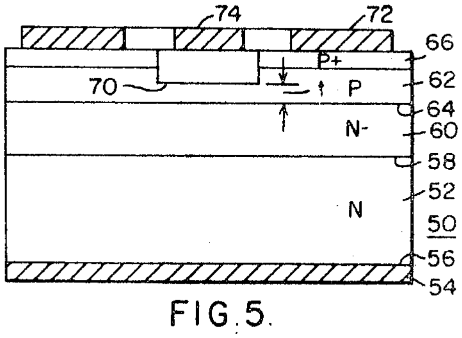
FIG. 5 is a view, partly in cross-section of a power transistor made in accordance with the teachings of this invention.

An alternate structure for a constant gain power transistor embodying the teachings of this invention is shown in FIG. 5. In FIG. 5, the power transistor 50 comprises a body 52 of N-type semiconductivity antimony or arsenic doped silicon semiconductivity having a preferred resistivity of 0.01 ohm-centimeter. An ohmic electrical contact 54 is affixed to a bottom surface 56 of the body 52.

The body 52 has a top surface 58 upon which is disposed an epitaxially grown region 60 of N-type semiconductivity silicon having a resistivity of from 2.5 ohm-centimeter to 3.5 ohm-centimeter and a thickness of from 18 to 22 microns. Preferably the region 60 is 20 microns in thickness and has a resistivity of 3 ohm-centimeter. The region 60 has a substantially constant impurity profile curve.

A region 62 of P-type semiconductivity silicon semiconductor material is grown on the region 60. The region 60 is at least 3 microns in thickness and preferably from 5 to 8 microns in thickness. The resistivity of the region 60 is at least 0.5 ohm-centimeter but not greater than 1 ohm-centimeter. Preferably the resistivity is as near to 0.5 ohm-centimeter as possible. A P-N junction 64 is formed by the coextensive surfaces of the regions 60 and 62.

A region 66 of P+-type semiconductivity is diffused within, or epitaxially grown on, the region 62. The P+ region 66 has a sheet resistivity of from 150 to 350 ohms per square and an impurity concentration greater than $5\times10^{18}$ atoms per cubic centimeter. The region 66 functions to reduce the collector-emitter saturation voltage by reducing the base spreading resistance.

Preferably the region 66 is formed by diffusion since either a selective or a non-selective diffusion process can be practiced. A selective diffusion process is preferred as an emitter region which is to be formed during a process step is diffused into the region 62 only and not through the region 66 and then into the region 62. This selective diffusion step avoids the degradation of gain of the device 50 relative to the collector current. The injection of carriers into a P region from an N+ region is accomplished easily and the current gain is high. If a non-selective diffusion process were employed, electrons from an N+ region would be injected into a P+ region. The flow of electrons would occur less readily than from an N+ to P region and the current gain is not as great as previously accomplished.

Therefore, since a high gain transistor is desired, selective diffusion is the preferred process step since carriers are then injected into a high resistivity base region.

A region 68 of N+-type semiconductivity is formed in the region 62. The region 68 has a sheet resistivity of 3 ohms per square and is diffused into the region 62 sufficiently far enough to create a base width of 3$\pm$0.3 micron. A P-N junction 70 is formed by the coextensive surfaces of the regions 62, 66, and 68.

Ohmic electrical contacts 72 and 74 are affixed to the respective regions 66 and 68 to complete the power transistor 50.

A plot of the gain versus the collector voltage of the transistor 50 will exhibit the same desirable properties as the plot of the same property for the processed body 10 shown in the graph of FIG. 4.

While the invention has been described with reference to particular embodiments and examples, it will be understood, of course, that modifications, substitutions, and the like may be made therein without departing from its scope.

We claim as our invention:

1. A constant gain high power transistor comprising (1) a body of N-type semiconductor material, said body having a resistivity not exceeding 0.10 ohm-centimeter, a top surface, and a bottom surface;

(2) a first epitaxially grown region of N-type semiconductivity silicon disposed on the top surface of said body, said first region having a resistivity of from 2.5 to 3.5 ohm-centimeters, and a thickness of from 18 to 22 microns, and a substantially uniform concentration of an impurity throughout said region;

(3) a second epitaxially grown region of P-type semiconductivity silicon semiconductor material disposed on said first epitaxially grown region, said region having a thickness of at least 3 microns and a resistivity of from 0.5 ohm-centimeter to 1 ohm-centimeter;

(4) a first P-N junction between said first and said second epitaxially grown regions;

(5) a region of N-type semiconductivity formed in, and including a portion of the top surface of, said second epitaxially grown region, said N-type region having a sheet resistivity of less than 3 ohms per square;

(6) a second P-N junction between said N-type region and said second epitaxial region, said second P-N junction having at least a portion thereof no greater than 3.3 microns, and no less than 2.7 microns, from said first P-N junction; and (7) an electrical contact affixed to each of said bottom surfaces of said body, to said second epitaxially grown region, and to said region of N-type semiconductivity formed in said second expitaxially grown region.

2. The electrical device of claim 1 in which the body of semiconductor material comprises an impurity selected from the group consisting of antimony and arsenic.

3. The electrical device of claim 2 in which the body of semiconductor material has a resistivity of 0.01 ohm-centimeter.

4. The electrical device of claim 3 in which said first epitaxially grown region has a resistivity of 3 ohm-centimeters and a thickness of 20 microns.

5. The electrical device of claim 4 in which said second epitaxially grown region has a thickness of from 5 microns to 8 microns and a resistivity of from 0.5 ohm-centimeter to 1.0 ohm-centimeter.

6. The electrical device of claim 5 in which the distance between a selected portion of the second P-N junction and the first P-N junction is 3 microns.

7. The electrical device of claim 6 in which said body comprises silicon.

8. The electrical device of claim 1 in which a region of P-type semiconductivity is disposed on said second epitaxial region, said region having an inner periphery, a portion of which is contiguous with the outer periphery of said N-type region formed in said second epitaxial region, said contiguous peripheries forming a P-N junction contiguous with said second P-N junction, said P-type region having a sheet resistivity of from 150 to 350 ohms per square and an impurity concentration of greater than $5 \times 10^{18}$ atoms per cubic centimeter.

9. The electrical device of claim 8 in which said P-type region is epitaxially grown on said second epitaxial region.

10. The electrical device of claim 8 in which said P-type region is diffused into said second epitaxial region exclusive of said formed N-type region.

References Cited

UNITED STATES PATENTS 3,244,950 4/1966 Ferguson ............ 317—235
3,370,995 2/1968 Lowery et al. .......... 148—175

JOHN W. HUCKERT, Primary Examiner

J. R. SHEWMAKER, Assistant Examiner